(12) United States Patent
Adusumilli et al.

(10) Patent No.: US 10,770,374 B2
(45) Date of Patent: Sep. 8, 2020

(54) THROUGH-SILICON VIAS FOR HETEROGENEOUS INTEGRATION OF SEMICONDUCTOR DEVICE STRUCTURES

(71) Applicant: GLOBALFOUNDRIES INC., Grand Cayman (KY)

(72) Inventors: Siva P. Adusumilli, Burlington, VT (US); Steven M. Shank, Jericho, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/255,505

(22) Filed: Jan. 23, 2019

(65) Prior Publication Data
US 2020/0235038 A1 Jul. 23, 2020

(51) Int. Cl.
| H01L 23/48 | (2006.01) |
| H01L 23/528 | (2006.01) |
| H01L 21/768 | (2006.01) |
| G02B 6/12 | (2006.01) |
| G02B 6/136 | (2006.01) |
| G02B 6/30 | (2006.01) |
| G02B 6/132 | (2006.01) |

(52) U.S. Cl.
CPC ........ H01L 23/481 (2013.01); G02B 6/12002 (2013.01); G02B 6/132 (2013.01); G02B 6/136 (2013.01); G02B 6/30 (2013.01); H01L 21/76898 (2013.01); H01L 23/5283 (2013.01); G02B 2006/12061 (2013.01); G02B 2006/12176 (2013.01)

(58) Field of Classification Search
CPC .... G02B 6/12002; G02B 6/132; G02B 6/136; G02B 6/30; G02B 2006/12061; G02B 2006/12176; H01L 23/481; H01L 23/5283; H01L 21/76898
USPC .......................................................... 385/14
See application file for complete search history.

(56) References Cited

U.S. PATENT DOCUMENTS

| 6,341,184 B1 * | 1/2002 | Ho .................. G02F 1/2257 385/1 |
| 6,790,775 B2 | 9/2004 | Fartash |
| 9,929,290 B2 | 3/2018 | Li et al. |
| 10,197,730 B1 | 2/2019 | Ngu et al. |
| 2007/0085215 A1 | 4/2007 | Budd et al. |
| 2013/0189483 A1 * | 7/2013 | Reinmuth .............. H05K 13/00 428/137 |
| 2016/0116672 A1 | 4/2016 | Leobandung |
| 2018/0006155 A1 * | 1/2018 | Holt .................... H01L 29/7849 |
| 2018/0029881 A1 * | 2/2018 | Cheng ................. B81C 1/00238 |

* cited by examiner

*Primary Examiner* — Jerry M Blevins
(74) *Attorney, Agent, or Firm* — Anthony Canale; Andrew M. Calderon; Roberts Calderon Safran & Cole, P.C.

(57) ABSTRACT

The present disclosure relates to semiconductor structures and, more particularly, to through-silicon vias (TSV) for heterogeneous integration of semiconductor device structures and methods of manufacture. The structure includes: a plurality of cavity structures provided in a single substrate; at least one optical device provided on two sides of the single substrate and between the plurality of cavity structures; and a through wafer optical via extending through the substrate, between the plurality of cavity structures and which exposes a backside of the at least one optical device.

19 Claims, 5 Drawing Sheets

THROUGH-SILICON VIAS FOR HETEROGENEOUS INTEGRATION OF SEMICONDUCTOR DEVICE STRUCTURES

FIELD OF THE INVENTION

The present disclosure relates to semiconductor structures and, more particularly, to through-silicon vias (TSV) for heterogeneous integration of semiconductor device structures and methods of manufacture.

BACKGROUND

Silicon photonics devices use silicon as an optical medium. The silicon is usually patterned with sub-micrometer precision, into microphotonic components. These components are used in fiber optic telecommunication systems. Silicon waveguides are also of great interest. Due to their unique guiding properties, they can be used for communications, interconnects, biosensors, and offer the possibility to support exotic nonlinear optical phenomena.

Silicon photonic devices typically are built on silicon which lies on top of a layer of silica, e.g., silicon on insulator. Silicon photonic devices can be made using existing semiconductor fabrication techniques, and because silicon is already used as the substrate for most integrated circuits, it is possible to create hybrid devices in which the optical and electronic components are integrated onto a single microchip.

However, silicon photonic devices and optical interconnects built on SOI substrates are costly. It is therefore important to lower cost by building these devices on bulk substrates. Creating waveguide bottom cladding layers on bulk silicon is complicated since there is no buried oxide layer.

SUMMARY

In an aspect of the disclosure, a structure comprises: a plurality of cavity structures provided in a single substrate; at least one optical device provided on two sides of the single substrate and between the plurality of cavity structures; and a through wafer optical via extending through the substrate, between the plurality of cavity structures and which exposes a backside to the at least one optical device.

In an aspect of the disclosure, a structure comprises: at least one optical device provided on a substrate and between a plurality of cavity structures; a through wafer optical via extending through the substrate, between the plurality of cavity structures; a deep trench isolation and SiGe seal adjacent to the through wafer optical via which provides a bottom waveguide cladding; and a shallow trench isolation adjacent to the least one optical device which provides side waveguide cladding.

In an aspect of the disclosure, a method comprises: forming multi-layer semiconductor devices on a single substrate; and forming a through wafer optical via extending through the single substrate and which contacts to a backside of an optical device of the multi-layer semiconductor devices on a first side of the single substrate.

BRIEF DESCRIPTION OF THE DRAWINGS

The present disclosure is described in the detailed description which follows, in reference to the noted plurality of drawings by way of non-limiting examples of exemplary embodiments of the present disclosure.

FIG. 1B shows a cross-sectional view of FIG. 1B, along lines A-A; whereas.

DETAILED DESCRIPTION

Figure 1A:
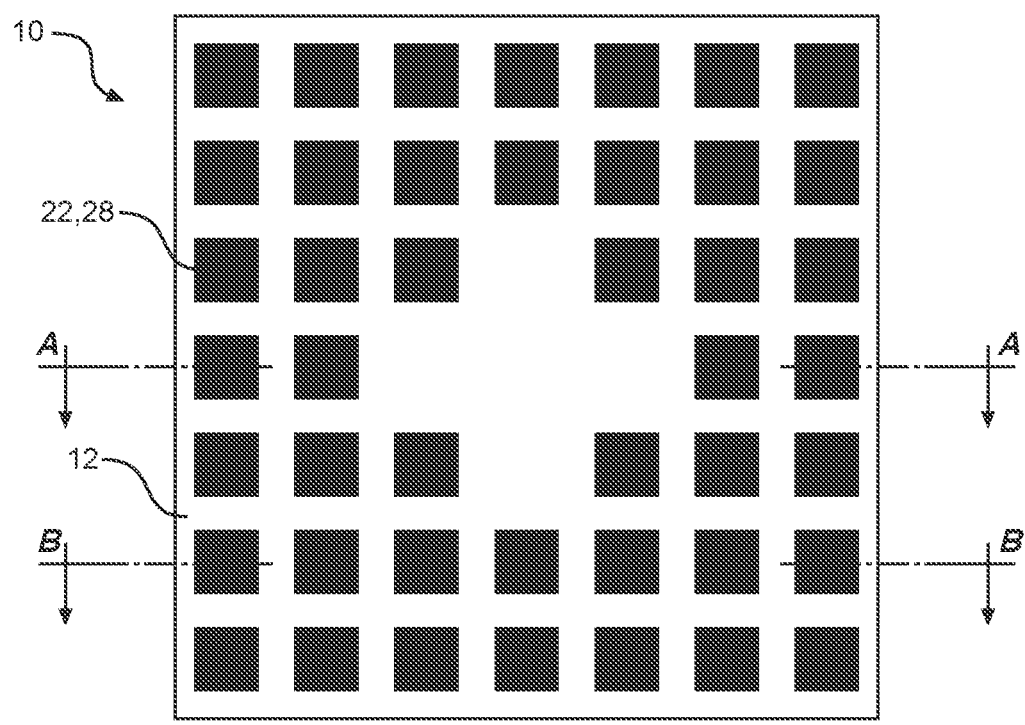
FIG. 1A shows a top view of cavity structures, amongst other features, and respective fabrication processes in accordance with aspects of the present disclosure.

The present disclosure relates to semiconductor structures and, more particularly, to through-silicon vias (TSV) for heterogeneous integration of semiconductor device structures and methods of manufacture. More specifically, the present disclosure relates to a structure and method of forming a TSV for heterogeneous integration of semiconductor device structures on bulk Si substrates with enhanced isolation using cladding material. Advantageously, the use of a bulk wafer with cavity isolation between a CMOS device reduces cost significantly, compared to using SOI wafers. In addition, a waveguide cladding reduces optical losses into the substrate at and away from a waveguide-to-optical via coupling region.

In embodiments, the present disclosure provides a through wafer optical via on bulk Si substrate with deep-shallow trench isolation (STI) and cavity structures sealed with SiGe material for bottom waveguide cladding and shallow-STI for side waveguide cladding. In specific embodiments, the through wafer optical via is a via exposing a resonator which is provided between cavity structures (top and bottom of the resonator). The via is filled with contact material and isolation material. In embodiments, CMOS devices are fabricated with photonic devices, e.g., waveguide structure, resonator, etc., and make use of the optical cladding structures for electrical isolation from the bulk Si substrate.

The through wafer optical via is surrounded by a deep trench isolation structure and shallow trench isolation structures, which also surround the cavity structures sealed with SiGe. In embodiments, two layers of cavity structures (partially or fully filled oxide) are provided in the same wafer. For example, an airgap cavity structure can be provided under the CMOS/waveguide structures on a top side of the wafer and an airgap cavity structure can be provided over the CMOS/waveguide on a bottom side of the wafer. A dual trench isolation region can be provided at both the top and bottom of the substrate (wafer). An oxidized SiGe seals the cavity structures. In embodiments, the through wafer optical via is between the cavity structures and oxidized SiGe seals. The through wafer optical via is fabricated by etching through the Si substrate. Also, in embodiments, although semiconductor devices are formed on different sides of the same wafer, there is no device processing on a second wafer and no bonding is required between the semiconductor devices.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1B:
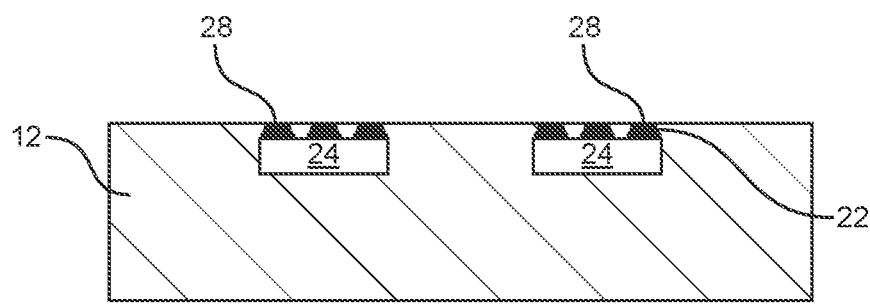
Figure 1C:
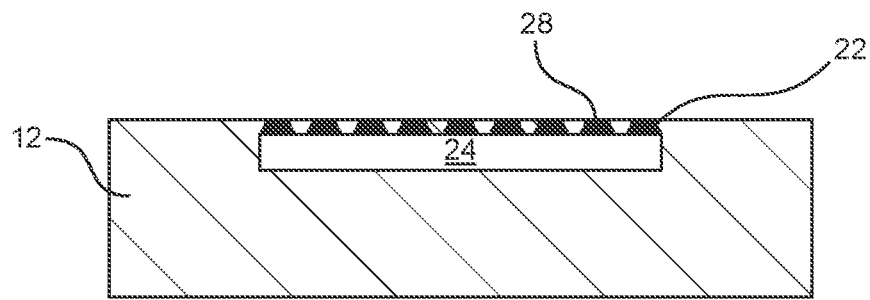
FIG. 1C shows a cross-sectional view of FIG. 1A, along lines B-B.

FIG. 1A shows a top view of cavity structures and respective fabrication processes in accordance with aspects of the present disclosure. FIG. 1B shows a cross-sectional view of FIG. 1A, along lines A-A; whereas, FIG. 1C shows a cross-sectional view of FIG. 1A, along lines B-B. In particular, the structure 10 includes a bulk substrate 12 (compared to silicon-on-insulator substrates). The bulk substrate 12 can also be referred to as a wafer. The bulk substrate 12 can comprise any semiconductor material such as, e.g., Si, GaAs, etc. In embodiments, the bulk substrate 12 is composed of crystalline silicon. In another embodiment, the bulk substrate 12 can be composed of any suitable semiconductor materials such as, e.g., SiGe, SiGeC, SiC, InAs, InP, and other III/V or II/VI compound semiconductors.

Still referring to FIGS. 1A-1C, one or more pad films (not shown), e.g., silicon dioxide (oxide) and/or silicon nitride (nitride), are deposited on the substrate 12. In embodiments, the nitride pad film can be deposited by a conventional deposition process, e.g., chemical vapor deposition (CVD). The oxide can be grown using a thermal oxidation or other methods known in the art such as CVD (chemical vapor deposition), PVD (plasma vapor deposition), or ALD (atomic layer deposition). Openings or trenches 22 are etched into the substrate 12. The trenches 22 can include, as viewed from above or below, "holes" and/or "bars". A sidewall liner (not shown) is formed on the sidewalls of the trenches 22 by depositing a dielectric material (e.g., oxide or nitride) and anisotropic etching the dielectric material from the bottom and top planar features of the structure.

As shown further in FIGS. 1A-1C, cavity structures 24 are selectively formed in the substrate 12 by a substrate etching process through the bottom of the trenches 22. The cavity structures 24 can be local cavity structures for waveguide cladding and electrical isolation. In embodiments, the pad films on the substrate surface and the spacer (e.g., sidewall liner) on the side of the trenches 22 protect the substrate 12 from being unintentionally etched during the cavity formation.

Figure 8:
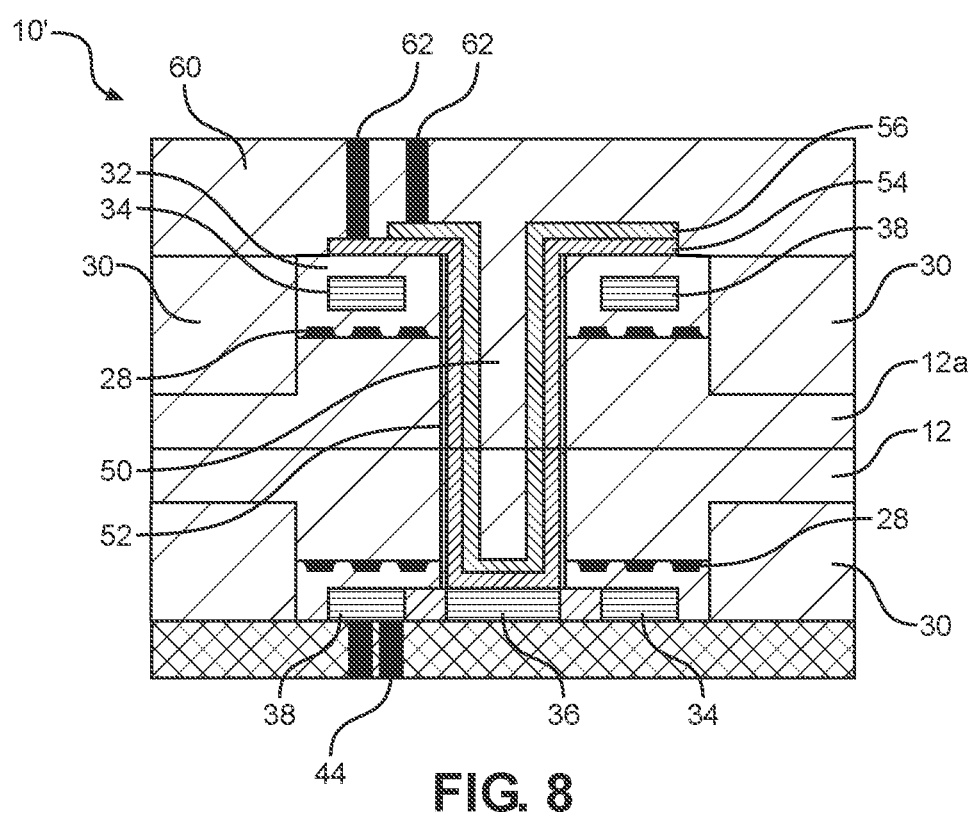
FIG. 8 shows an alternative structure and respective fabrication processes in accordance with aspects of the present disclosure.

Following the formation of the sidewall liner or spacer and any optional clean(s), exposed substrate 12 at the bottom of the trench 22 can be removed to form the cavity structures 24 by using a wet etching process or dry etching process as is known in the art such that no further explanation is required. In embodiments, the cavity structures 24 can be formed under certain devices, e.g., waveguide structure and CMOS devices (shown in FIG. 2). The cavity structures 24 can be lined with oxide or completely filled with oxide (as shown in FIG. 8). After formation of the cavity structures 24, the sidewall liner and pad dielectrics are removed, exposing the upper surface of the substrate 12 and the sidewalls of the trenches 22. In embodiments, the sidewall liner and pad dielectrics can be removed by a conventional etching process selective to such materials, e.g., only or a combination of hot phosphorous followed by an HF chemistry or vice-versa.

In embodiments, a material 28 is deposited or epitaxially grown on the surface of the substrate 12 including on sidewalls of the trenches 22 and sidewalls of the cavity structures 24. In embodiments, the material 28 can be epitaxial SiGe deposited or grown using ultra high vacuum CVD (UHVCVD); although other semiconductor materials, poly or epi films, and deposition processes are also contemplated herein. By way of example, SiGe material can be deposited or grown at a temperature of about 600° C. to 750° C. It should be understood that different thicknesses of the material 28 can be applied, depending on the critical dimension of the trenches 22.

As further shown in FIGS. 1A-1C, following the deposition or growth of the material 28, the wafer (substrate) is heated to equal to or greater than the reflow temperature of material 28 so that material 28 fills in the trench 22. In this way, the cavity structures 24 are sealed (e.g., filled with air). Prior to sealing the cavity structures 24 they can be lined or completely filled with oxide material. Alternatively, the fill process can occur at a later processing step as described with respect to FIG. 8. During the reflow temperature, some of the material 28 can remain on the surface of the structure, which can act as an etch stop layer for subsequent processes. SiGe material 28 can be reflowed into the opening of the trench 22 to plug or fill the top of the trench 22 without filling in the cavity 24. In embodiments, the reflow temperature of the material 28 is about 800° C. to 1050° C. and the reflow time is anywhere up to about 600 seconds.

Figure 2:
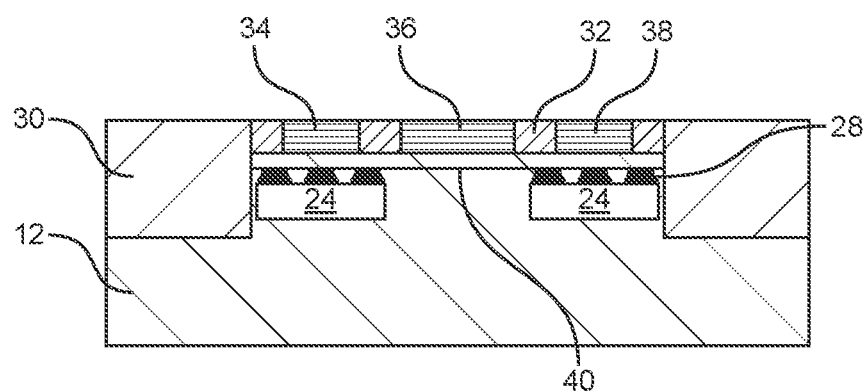
FIG. 2 shows an optional deep trench isolation structure surrounding devices, amongst other features, and respective fabrication processes in accordance with aspects of the present disclosure.

FIG. 2 shows an optional deep trench isolation (DTI) structure 30 surrounding devices, amongst other features, and respective fabrication processes in accordance with aspects of the present disclosure. In embodiments, the deep trench isolation structures 30 surround a plurality of devices 34, 36 and 38 formed through shallow trench isolation (STI) structures 32. In one illustrative non-limiting example, the device 34 is an optical waveguide structure, the device 36 is a resonator and the device 38 is a conventional transistor, e.g., CMOS device. In embodiments, the deep trench isolation structures 30 provide isolation for bottom waveguide cladding. In addition, the shallow trench isolation (STI) structures 32 are local isolations for side waveguide cladding.

In embodiments, the devices 34, 36 and 38 are formed on epitaxially grown semiconductor material 40 (over the material 28, e.g., SiGe material) through photolithography and etching processes known to those of skill in the art. After the etch process, the trenches are filled with oxide and can be planarized using conventional chemical mechanical polishing (CMP) techniques, with subsequent formation of the devices 34, 36, 38. It should be understood by those of skill in the art that the cavity structures 24 are local cavity structures which provide isolation to the substrate 12 and the resonator 34, as examples.

Still referring to FIG. 2, the deep trench isolation structures 30 and the shallow trench isolation structures 32 provide dual trench isolation features for improved isolation of the devices. In embodiments, the deep trench isolation structures 30 and the shallow trench isolation structures 32 can be formed in separate fabrication processes using conventional lithography, etching and deposition methods known to those of skill in the art. For example, a resist formed over the epitaxially grown semiconductor material 40 is exposed to energy (light) to form a pattern (opening). An etching process with a selective chemistry, e.g., reactive ion etching (RIE), will be used to form one or more trenches in the epitaxially grown semiconductor material 40 through the openings of the resist. The resist can then be removed by a conventional oxygen ashing process or other known stripants. Following the resist removal, insulator material, e.g., oxide, can be deposited by any conventional deposition processes, e.g., chemical vapor deposition (CVD) processes. Any residual material on the surface of the epitaxially grown semiconductor material 40 can be removed by conventional chemical mechanical polishing (CMP) processes.

In embodiments, the devices 34, 36, 38 are conventional devices formed using conventional fabrication processes such that no further explanation is required herein. In embodiments, the devices 34, 36 and 38 are formed through the shallow trench isolation structures 32. The device 34, e.g., waveguide structure, and the device 38, e.g., transistor, are formed over the cavity structures 24, whereas, the device 36, e.g., resonator, is formed between the cavity structures 24.

In embodiments, the deep trench isolation structures 30 and the shallow trench isolation structures 32 can be etched separately, but can be filled with isolation material at the same time for cost savings. In further embodiments, the shallow trench isolation structures can be formed prior to the deep trench isolation structures using separate conventional lithography or hardmask techniques, followed by conventional etching processes. The isolation material can be, e.g., oxide. The deposition of the oxide material can be a CVD process performed at the same time for cost savings, followed by a CMP process. The CMP process can be performed at the same time for cost savings.

Figure 3:
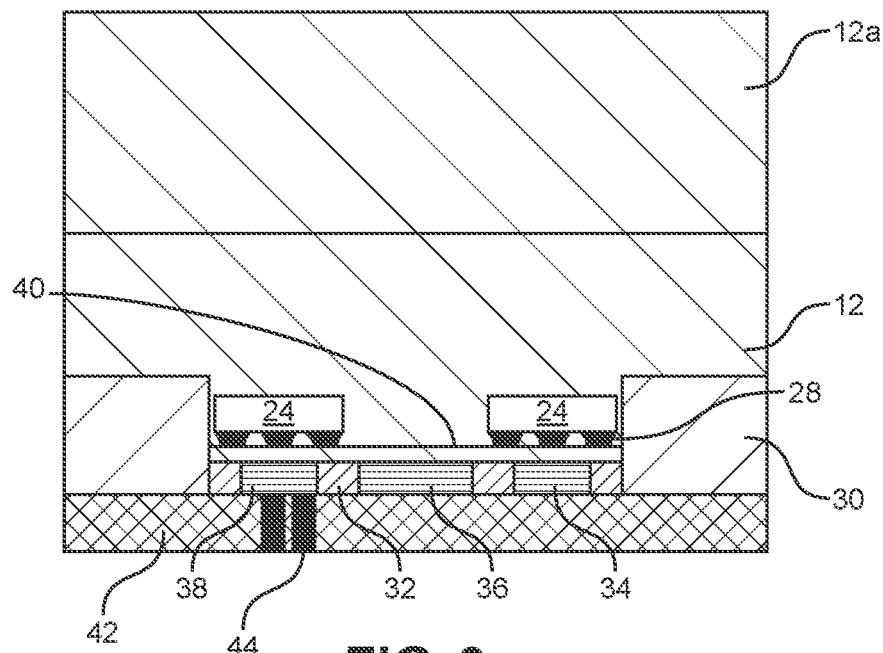
FIG. 3 shows a backside of the wafer, amongst other features, and respective fabrication processes in accordance with aspects of the present disclosure.

FIG. 3 shows a handle wafer 42 attached to the substrate 12 and respective fabrication processes in accordance with aspects of the present disclosure. More specifically, the structure of FIG. 2 is turned upside down and a handle wafer 42 is bonded to the substrate 12. In embodiments, the bond interface between the handle wafer 42 and the substrate 12 is below devices, 34, 36, 38 (compared to conventional structures where it is between upper and lower devices). The handle wafer 42 can be bonded to the substrate 12 prior to or after the substrate 12 is flipped over. In embodiments, the handle wafer 42 can be bonded to the substrate 12 using an oxide bonding technique, as an example. In some embodiments, the handle wafer 42 can be bonded to the substrate 12 using a suitable bonding method without requiring the use of intermediate metallic bonding materials, such as a direct an oxide bonding technique, for example. Other examples include oxide bonding, anodic bonding, and plasma activated bonding, to name a few. The handle wafer 42 can be quartz, Si or other handle wafer material known in the art. Moreover, FIG. 3 shows a backside 12a of the substrate 12, on an opposing side from the devices 34, 36, 38.

Figure 4:
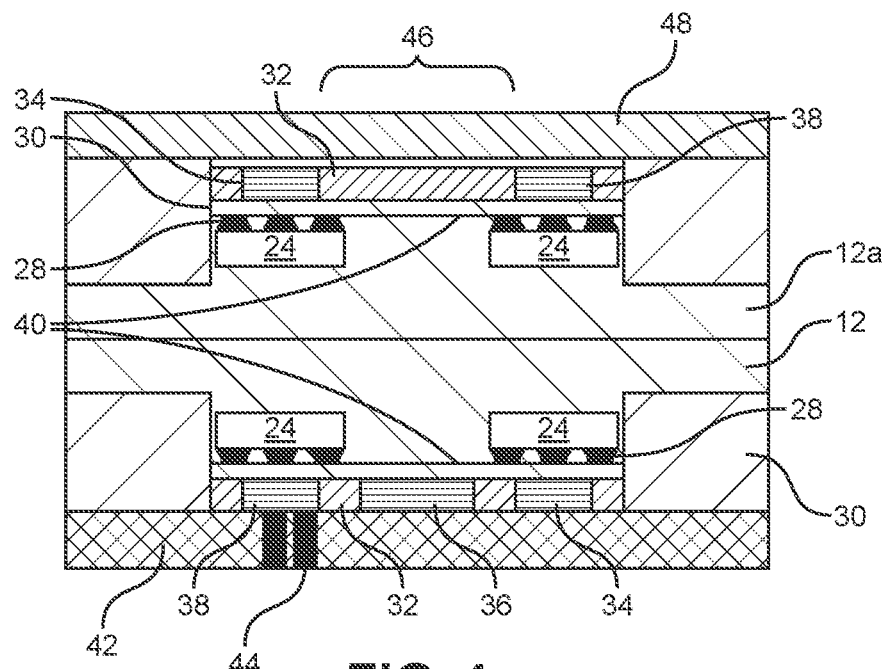
FIG. 4 shows additional device fabrication on the backside of the wafer, amongst other features, in accordance with aspects of the present disclosure.

FIG. 4 shows devices 34, 38 formed on the backside 12a of the substrate 12, amongst other features. In embodiments, all of the devices are now on a single wafer, e.g., substrate 12 (compared to different wafers), hence providing multi-layer semiconductor devices on the single substrate.

More specifically, in the processes similar to that already described with respect to FIGS. 1A-2, deep trench isolation structures 30 are formed surrounding a plurality of devices 34 and 38. The deep trench isolation structures 30 and the plurality of devices 34, 38 are formed through the shallow trench isolation structures 32. The devices 34, 28 are formed on epitaxially grown semiconductor material 40. In embodiments, the device 34 is an optical waveguide structure and the device 38 is a transistor, e.g., CMOS device. It is noted, though, that the resonator is not provided on the backside 12a of the substrate 12; instead, an open space 46 is provided between the devices 34, 38, e.g., between the cavity structures 24 sealed with the material 28. In embodiments, the opening space 46 is also aligned with the resonator 36 formed in the substrate 12. Following formation of the devices 34, 38, a layer of dielectric material (oxide) 48 is deposited over the devices 34, 38, deep trench isolation structures 30 and shallow trench isolation structures 32. The layer of dielectric material (oxide) 48 can be planarized using a conventional CMP process.

Figure 5:
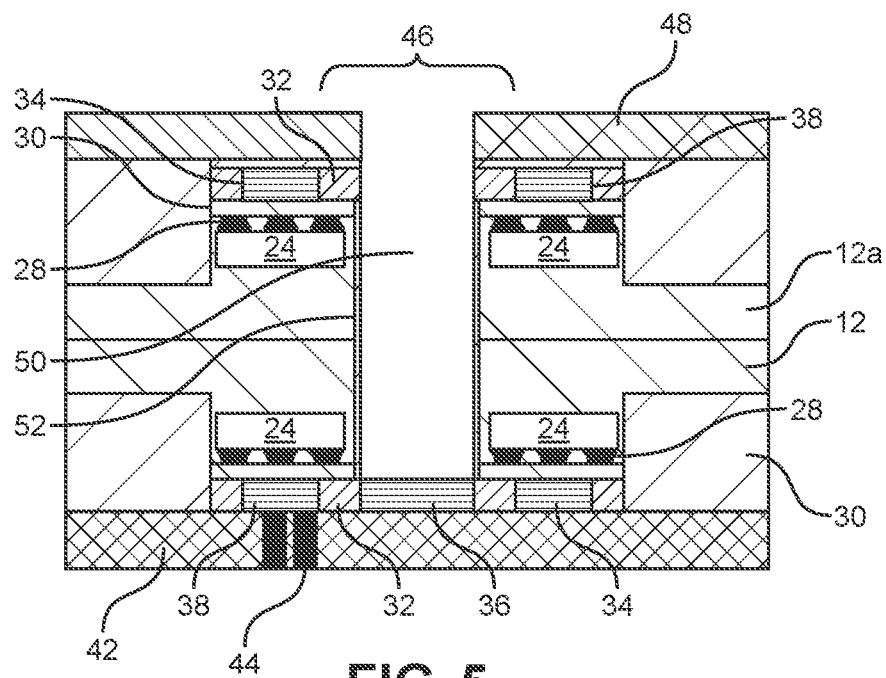
FIG. 5 shows a through wafer optical via, amongst other features, and respective fabrication processes in accordance with aspects of the present disclosure.

FIG. 5 shows a through wafer optical via 50, amongst other features, and respective fabrication processes in accordance with aspects of the present disclosure. More specifically, a through wafer optical via 50 is etched through the substrate 12 to expose a top surface of the resonator 36 of the substrate 12. In this way, an optical interconnect can be formed using a single Si etch vs. a multi-layer stack etch of Si/oxide/Si/oxide/nitride. The through wafer optical via 50 is provided between the cavity structures 24 of substrate 12, within the open space 46. The through wafer optical via 50 can be fabricated by any conventional lithography and etching technique, e.g., RIE. An insulator material 52, e.g., oxide material, is deposited on sidewalls of the through wafer optical via 50, followed by an anisotropic etching process to remove any excess insulator material from a bottom of the through wafer optical via 50 (and surface of the backside 12a of the substrate 12) in order to expose the resonator 36. The insulator material 52 will remain on the sidewalls of the through wafer optical via 50.

Figure 6:
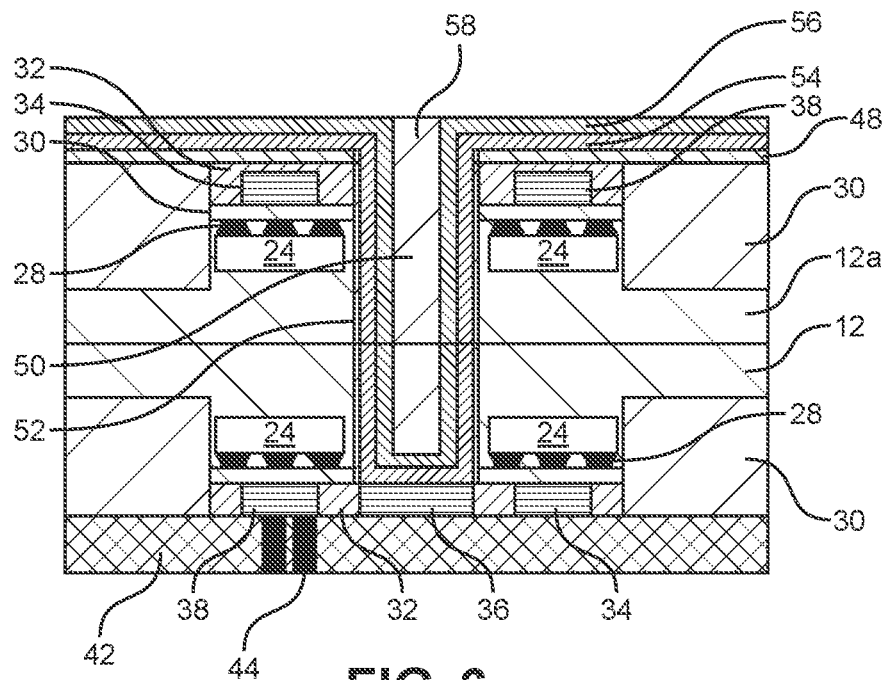
FIG. 6 shows the through wafer optical via lined with conductive material, amongst other features, and respective fabrication processes in accordance with aspects of the present disclosure.

In FIG. 6, the through wafer optical via 50 is lined with P+ poly material 54 and N+ poly material 56. In embodiments, the P+ poly material 54 and N+ poly material 56 can be deposited using a conventional atomic layer deposition (ALD) process. In embodiments, the P+ poly material 54 and N+ poly material 56 will also be deposited on the surface of the dielectric material 48. In this way, a polysilicon waveguide is optically connected to the top and bottom of substrate. Also, electrical contacts can be provided from the backside of the device, e.g., resonator 34, through substrate 12.

The P+ poly material 54 and N+ poly material 56 can have varying thicknesses, e.g., about 5 nm to 10 nm; however, it should be understood that the P+ poly material 54 and N+ poly material 56 should not completely fill the through wafer optical via 50. Instead, the remaining space within the through wafer optical via 50 will be filled with an oxide material 58. Any excess oxide material 58 can be removed from the surface of the N+ poly material 56, outside of the through wafer optical via 50, by conventional CMP processes.

Figure 7:
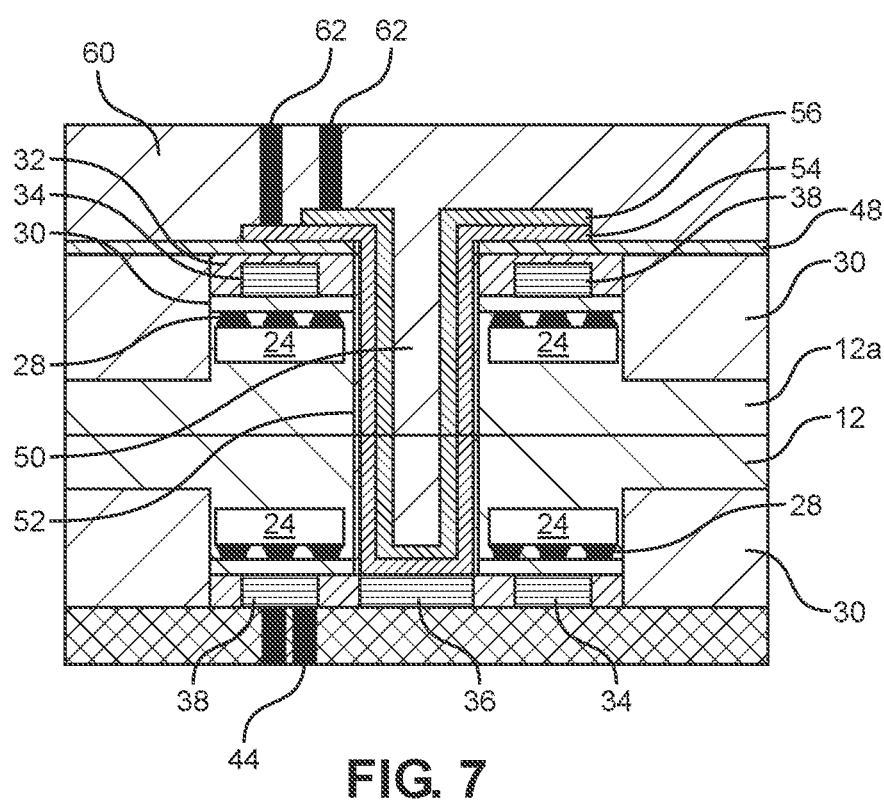
FIG. 7 shows contacts to a CMOS device through the through wafer optical via, amongst other features, and respective fabrication processes in accordance with aspects of the present disclosure.

Referring to FIG. 7, the lining of the P+ poly material 54 and N+ poly material 56 are etched back (in an offset manner) resulting in both the P+ poly material 54 and N+ poly material 56 being exposed. In embodiments, the P+ poly material 54 and N+ poly material 56 can be etched using conventional lithography and etching techniques, e.g., RIE, in order to expose both the P+ poly material 54 and N+ poly material 56. A dielectric material 60, e.g., oxide, is deposited over the P+ poly material 54 and N+ poly material 56. Contacts 62 are formed into the dielectric material 60, directly contacting both the P+ poly material 54 and N+ poly material 56. The contacts 62 are formed by conventional lithography, etching and deposition techniques known to those of ordinary skill in the art. In embodiments, the contacts 62 can be any conductive material, e.g., copper, aluminum, etc. In embodiments, connections 44 can also be fabricated into the handle wafer 42 using conventional lithography, etching and metal deposition processes known to those of skill in the art. For example, the connections 44 can be metal via interconnects, connecting to the device 38.

FIG. 8 shows an alternative structure 10' and respective fabrication processes in accordance with aspects of the present disclosure. In FIG. 8, for example, the cavity structures are filled with oxide material. In embodiments, the cavity structures can be filled with an oxide material by extending the width of the through wafer optical via 50 to expose an interior of the cavity structures. An oxidation process is then performed followed by filling the cavity structures with an oxide material. The through wafer optical via 50 is then lined with the P+ poly material 54 and N+ poly material 56. A dielectric material 58, e.g., oxide, is deposited over the P+ poly material 54 and N+ poly material 56, with contacts 60 formed in the dielectric material 58, directly contacting both the P+ poly material 54 and N+ poly material 56 (as already described herein).

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a plurality of enclosed cavity structures provided in a single substrate;
   at least one optical device provided on two sides of the single substrate and between the plurality of enclosed cavity structures; and
   a through wafer optical via extending through the substrate, between the plurality of enclosed cavity structures and which exposes a backside to the at least one optical device,
   wherein the plurality of enclosed cavity structures have walls formed from semiconductor material of the single substrate and sealed with a reflowed epitaxial material at an upper portion.

2. The structure of claim 1, wherein the at least one optical device is a resonator on an epitaxial material grown on the substrate on a first side of the single substrate.

3. The structure of claim 1, wherein the at least one optical device is a plurality of optical devices on both sides of the single substrate.

4. The structure of claim 3, wherein the plurality of optical devices includes a waveguide structure and a resonator on a first side of the single substrate and a waveguide structure on a second side of the single substrate.

5. The structure of claim 4, further comprising a transistor on both the first side of the single substrate and the second side of the single substrate, wherein:
   the transistors are located over a separate cavity structure of the plurality of enclosed cavity structures on the first side of the single substrate and second side of the single substrate;
   the waveguide structures are located over another separate cavity structure of the plurality of enclosed cavity structures on the first side of the single substrate and second side of the single substrate; and
   the resonator on the first side of the substrate lies between the waveguide structures and the transistors.

6. The structure of claim 5, wherein the plurality of enclosed cavity structures are sealed with SiGe material.

7. The structure of claim 5, wherein the plurality of optical devices are on the first side of the single substrate and the second side of the single substrate.

8. The structure of claim 7, wherein the plurality of enclosed cavity structures are sealed with oxidized SiGe material, the oxidized SiGe material is between substrate material and the waveguide structures on both the first side of the single substrate and the second side of the single substrate, and the substrate material and the transistors on both the first side of the single substrate and the second side of the single substrate.

9. The structure of claim 5, wherein the plurality of cavity structures are filled with insulator material.

10. The structure of claim 5, further comprising trench isolation regions at both at a top portion of the single substrate and a bottom portion of the single substrate.

11. A structure comprising:
   at least one optical device provided on a substrate and between a plurality of cavity structures;
   a through wafer optical via extending through the substrate, between the plurality of cavity structures;
   a deep trench isolation and SiGe seal adjacent to the through wafer optical via which provides a bottom waveguide cladding; and
   a shallow trench isolation adjacent to the least one optical device which provides side waveguide cladding,
   wherein the at least one optical device is a plurality of optical devices on both sides of the substrate, the plurality of optical devices include a waveguide structure and a resonator on a first side of the substrate and a waveguide structure on a second side of the substrate, and the through wafer optical via extends through the substrate and contacts a backside of the resonator.

12. The structure of claim 11, wherein the at least one optical device is a resonator on a first side of the substrate and positioned between the plurality of cavity structures, and the through wafer optical via extends through the substrate and contacts a backside of the resonator.

13. The structure of claim 12, wherein the resonator is located on an epitaxial material grown on the substrate.

14. The structure of claim 11, wherein:
the SiGe seal seals the plurality of cavity structures; and
the deep trench isolation, the cavity structures and the shallow trench isolation are provided on the first side of the substrate and the second side of the substrate.

15. The structure of claim 14, further comprising a transistor on both the first side of the substrate and the second side of the substrate, wherein:
the transistors are located over a first cavity structure of the plurality of cavity structures on the first side of the substrate and the second side of the substrate;
the waveguide structures are located over second separate cavity structure of the plurality of cavity structures on the first side of the substrate and second side of the substrate; and
the resonator on the first side of the substrate lies between the waveguide structures and the transistors.

16. The structure of claim 15, wherein the SiGe seal is oxidized SiGe material.

17. The structure of claim 14, wherein the plurality of cavity structures are filled with insulator material.

18. A method comprising:
forming multi-layer semiconductor devices on a single substrate; and
forming a through wafer optical via extending through the single substrate and which contacts to a backside of an optical device of the multi-layer semiconductor devices on a first side of the single substrate, wherein the forming multi-layer semiconductor devices on a single substrate comprises:
forming a plurality of cavity structures in the single substrate; and
forming a plurality of optical devices on both sides of the single substrate and between the plurality of cavity structures, wherein the plurality of optical devices includes a waveguide structure and a resonator on a first side of the single substrate and a waveguide structure on a second side of the single substrate, and
wherein the through wafer optical via is formed between the plurality of cavity structures and exposes a backside of at least one of the plurality of optical devices.

19. The method of claim 18, further comprises creating shallow trench isolation structures and deep trench isolation structures on both sides of the single substrate.

* * * * *